(12) United States Patent
Scharf et al.

(10) Patent No.: US 10,886,186 B2
(45) Date of Patent: Jan. 5, 2021

(54) SEMICONDUCTOR PACKAGE SYSTEM

(71) Applicant: Infineon Technologies AG, Neubiberg (DE)

(72) Inventors: Thorsten Scharf, Regensburg (DE); Ralf Otremba, Kaufbeuren (DE); Thomas Bemmerl, Schwandorf (DE); Irmgard Escher-Poeppel, Duggendorf (DE); Martin Gruber, Schwandorf (DE); Michael Juerss, Regensburg (DE); Thorsten Meyer, Regensburg (DE); Xaver Schloegel, Sachsenkam (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/365,837

(22) Filed: Mar. 27, 2019

(65) Prior Publication Data
US 2019/0304858 A1  Oct. 3, 2019

(30) Foreign Application Priority Data
Mar. 28, 2018  (DE) ......................... 10 2018 204 764

(51) Int. Cl.
*H01L 23/053* (2006.01)
*H01L 23/08* (2006.01)
*H01L 23/00* (2006.01)
*H01L 23/40* (2006.01)

(52) U.S. Cl.
CPC .......... *H01L 23/053* (2013.01); *H01L 23/08* (2013.01); *H01L 23/4093* (2013.01); *H01L 24/05* (2013.01)

(58) Field of Classification Search
CPC .............. H01L 23/053; H01L 23/4093; H01L 2924/1815; H01L 23/3107; H01L 23/49562; H01L 23/04; H01L 23/08; H01L 23/367; H01L 24/00
See application file for complete search history.

(56) References Cited

U.S. PATENT DOCUMENTS

| 5,379,188 A * | 1/1995 | Winslow ............. H01L 23/4093 165/185 |
| 5,660,917 A | 8/1997 | Fujimori et al. |
| 6,191,478 B1 * | 2/2001 | Chen ................... H01L 23/4093 257/718 |
| 2002/0108744 A1 | 8/2002 | Bowman et al. |

(Continued)

FOREIGN PATENT DOCUMENTS

| DE | 198 54 396 | 6/2000 |
| JP | 2017168825 | 9/2017 |

*Primary Examiner* — Yasser A Abdelaziez
(74) *Attorney, Agent, or Firm* — Dicke, Billig & Czaja, PLLC

(57) ABSTRACT

A semiconductor package system comprises a semiconductor package and a cap. The semiconductor package comprises a die pad, a chip mounted or arranged to a first main face of the die pad and an encapsulation body encapsulating the chip and the die pad. The cap covers at least partly an exposed second main face of the die pad. The cap comprises a cap body of an electrically insulating and thermally conductive material and a fastening system fastening the cap to the semiconductor package. The fastening system extends from the cap body towards the encapsulation body or along a side surface of the semiconductor package.

24 Claims, 12 Drawing Sheets

(56) References Cited

U.S. PATENT DOCUMENTS

| | | |
|---|---|---|
| 2003/0132511 A1 | 7/2003 | Gerbsch et al. |
| 2004/0222517 A1* | 11/2004 | Robertson ........... H01L 23/4093 |
| | | 257/718 |
| 2007/0098334 A1 | 5/2007 | Chen |
| 2013/0294032 A1* | 11/2013 | Stella ...................... H05K 7/20 |
| | | 361/718 |
| 2014/0264944 A1 | 9/2014 | Otremba et al. |
| 2015/0102479 A1 | 4/2015 | Fuergut et al. |
| 2016/0049350 A1* | 2/2016 | Matsuda ............... H01L 23/367 |
| | | 257/717 |
| 2017/0098598 A1 | 4/2017 | Otremba et al. |
| 2017/0117208 A1 | 4/2017 | Kasztelan et al. |
| 2019/0077133 A1 | 3/2019 | Sawaguchi et al. |

\* cited by examiner

SEMICONDUCTOR PACKAGE SYSTEM

CROSS-REFERENCE TO RELATED APPLICATION

This Utility patent application claims priority to German Patent Application No. 10 2018 204 764.2, filed Mar. 28, 2018, which is incorporated herein by reference.

FIELD

This disclosure relates to a semiconductor package system comprising a semiconductor package and a cap. The present disclosure further relates to a cap. The present disclosure further relates to a use of a cap for dissipating heat from a semiconductor package.

BACKGROUND

A semiconductor package may have an exposed die pad. The exposed die pad may allow for a better cooling of a semiconductor chip or die which is arranged inside the semiconductor package. A cooling element may be attached to the exposed die pad for heat dissipation. An interface between the exposed die pad and the cooling element may provide a good thermal interface having a high thermal conductivity.

The exposed die pad may need to be electrically insulated from the cooling element. The exposed die pad may be e.g. a drain contact of a transistor die. The die pad may be on drain potential during operation. In case of e.g. a low side switch an electrical insulation between the exposed drain contact and the cooling element may then be necessary.

SUMMARY

A semiconductor package system may comprise a semiconductor package and a cap. The semiconductor package may comprise a die pad, a semiconductor chip mounted to a first main face of the die pad and an encapsulation body which may encapsulate the semiconductor chip and the die pad. A second main face of the die pad may be at least partially exposed. The cap may cover at least partially the exposed second main face of the die pad. The cap may comprise a cap body of an electrically insulating and thermally conductive material and a fastening system. The fastening system may fasten the cap to the semiconductor package. The fastening system may extend from the cap body towards the encapsulation body or along a side surface of the semiconductor package.

A cap may be configured to cover an at least partly exposed die pad of a semiconductor package. The cap may comprise a cap body of an electrically insulating and thermally conductive material. The cap may comprise a fastening system. The fastening system may be configured to fasten the cap to the semiconductor package. The fastening system may extend from the cap body.

A cap may be used for dissipating heat from a semiconductor package. The cap may be fastened by a fastening system to a semiconductor package. The fastening system may be configured to fasten the cap by one out of a snap connection and a matched joint connection to the semiconductor package.

BRIEF DESCRIPTION OF THE DRAWINGS

The accompanying drawings are included to provide a further understanding of examples and are incorporated in and constitute a part of this description. The drawings illustrate examples and together with the description serve to explain principles of examples. Other examples and many of the intended advantages of examples will be readily appreciated as they become better understood by reference to the following detailed description.

DETAILED DESCRIPTION

Figure 1A:
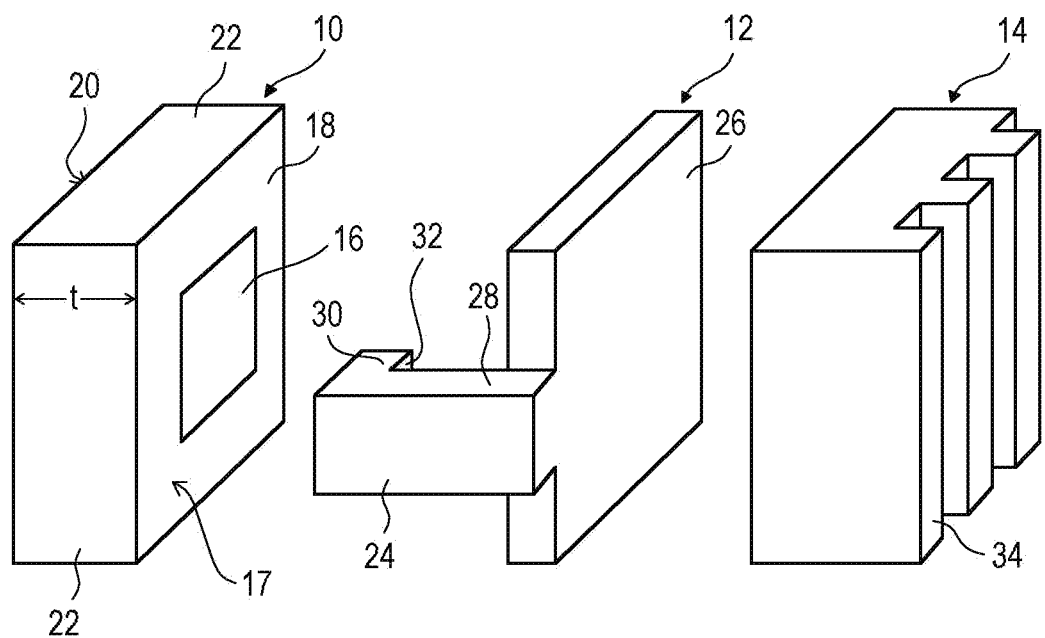
FIGS. 1A and 1B illustrate schematically a semiconductor package, a cap and a cooling element before and after assembly.

In the following, embodiments are described with reference to the drawings wherein like reference numerals are generally utilized to refer to like elements throughout. In the following description, for purposes of explanation, numerous specific details are set forth in order to provide a thorough understanding of one or more aspects of embodiments. However, it may be evident to a person skilled in the art that one or more aspects of the embodiments may be practiced with a lesser degree of these specific details. The following description is therefore not to be taken in a limiting sense, and the scope of protection is defined by the appended claims.

The various aspects summarized may be embodied in various forms. The following description shows by way of illustration various combinations and configurations in which the aspects may be practiced. It is understood that the described aspects and/or embodiments are merely examples and that other aspects and/or embodiments may be utilized and structural and functional modifications may be made without departing from the scope of the present disclosure. In addition, while a particular feature or aspect of an embodiment may be disclosed with respect to only one of several implementations, such feature or aspect may be combined with one or more other features or aspects of the other implementations as it may be desired and advantageous for any given or particular application. Further, to the extent that the terms "include", "have", "with" or other variants thereof are used in either the detailed description or the claims, such terms are intended to be inclusive in a manner similar to the term "comprise". Also, the term "exemplary" is merely meant as an example, rather than the best or optimal. In particular regard to the various functions performed by the above described structures, the terms (including a reference to a "means") used to describe such structures are intended to correspond, unless otherwise indicated, to any structure which performs the specified function of the described structure (e.g., that is functionally equivalent), even though not structurally equivalent to the disclosed structure which performs the function in the herein illustrated exemplary implementations of the invention.

Caps, semiconductor package systems and methods for manufacturing the cap as well as a possible use of the cap are described herein. Comments made in connection with the described cap may also hold true for a corresponding system and a corresponding method and use and vice versa. For example, if a specific material of a cap is described, a corresponding system may comprise the specific material and a corresponding method for manufacturing the cap may include an act of providing the material in a suitable manner, even if such an act is not explicitly described or illustrated in the figures. In addition, the features of the various exemplary aspects described herein may be combined with each other unless specifically noted otherwise.

Semiconductor packages may include a semiconductor chip or die. Throughout the description the term chip may always also include a die and vice versa. A semiconductor package may also include a plurality of chips. A semiconductor package may comprise a chip stack. A chip stack includes a plurality of chips mounted one above the other. The chip or the plurality of chips may include input/output pads that may be electrically connected to terminals external to the package such as, e.g. solder pads or leads.

A semiconductor chip included in a semiconductor package may be arranged on a die pad. The semiconductor chip may be a power semiconductor die. The semiconductor chip may be configured to work in a voltage range above 1000 Volts. The semiconductor chip may be configured to work in a voltage range above 1500 Volts. A die pad may be part of a leadframe. A semiconductor chip mounted on a die pad and electrically connected to terminals may be surrounded by an encapsulation material which forms an encapsulation body. The encapsulation body may encapsulate partly the die pad. The encapsulation material may enclose the chip completely and protect the chip from the outer environment. The terminals or leads may extend at least partly from the encapsulation material. The encapsulation material may be a mold compound.

A semiconductor package may comprise an exposed die pad. An exposed die pad may be at least partially exposed. An exposed die pad is a die pad comprising a surface which is not covered by an encapsulation material. More specifically, the exposed die pad surface may be opposed to a surface of the die pad on which a chip is mounted. An exposed die pad may be electrically connected to a circuit board for electrically connecting the chip included in the semiconductor package.

An exposed die pad may be thermally coupled to a cooling element adapted to dissipate heat. The cooling element may be a heat sink. The cooling element may comprise cooling fins. Cooling fins may augment the surface of the cooling element for providing good heat dissipation. A cooling element may be made of or comprise a metal.

A cooling element may be part of a circuit board e.g. a printed circuit board (PCB). A cooling element integrated into a circuit board may comprise through-connections or vias through the circuit board. The through-connections may comprise a material of high thermal conductivity. The through-connections may connect on one side of the circuit board the exposed die pad and on the other side of the circuit board a heat sink. The through-connections and the heat sink may form together the cooling element.

A cooling element may be integrated into the circuit board in form of a metal plate. A metal plate integrated into a circuit board as cooling element may comprise copper.

A cooling element may be fixed to a circuit board. A cooling element may be screwed to a circuit board. A cooling element may be fixed, e.g. screwed to a semiconductor package.

Examples of semiconductor packages with an exposed die pad may comprise so-called TO (transistor outline) packages. A TO package may be a leaded package for a through-hole mounting. Examples of TO packages may include a TO-220 package which is a power package comprising an exposed die pad intended for power semiconductors. Exemplary TO packages may comprise a TO-247 which is also a power semiconductor package. A TO package may be a surface mount device (SMD) for surface mounting. Examples of TO packages may include a TO-252 package and a TO-263 package which are also power semiconductor packages.

A further example semiconductor package may be a DSO (dual small outline) package. A DSO package may be a surface mounted package. A DSO package may have a top-side cooling. A top-side cooling corresponds to an exposed die pad on a surface of the DSO package which is directed opposite to the circuit board to which the package is mounted. A DSO package may comprise bottom-side cooling. A bottom-side cooling package comprises an exposed die pad which is directed to the mounting surface. A DSO package may include a double-sided cooling.

Further examples of semiconductor packages may comprise a leadless package. A leadless package may comprise an exposed die pad on an upper side of the package.

Further examples of semiconductor packages may comprise DDPAK (Double Decawatt Package) or QDPAK (Quadruple Decawatt Package).

A semiconductor package may comprise a through-hole. A through-hole may extend from a package surface on which the exposed die pad is arranged to a surface opposite this surface. A through-hole may allow attachment of a cooling element to the semiconductor package, e.g. by a screw.

Although the description names exemplary semiconductor packages and shows in its drawings several semiconductor packages, it is to be understood that this is in no way limiting and any other semiconductor package may be provided with an adapted cap. Any semiconductor package may be configured for top-side, bottom-side or double-sided cooling.

A cap may provide a thermal interface to an at least partially exposed die pad of a semiconductor package. A cap may provide a thermal interface between an exposed die pad or more generally an exposed cooling surface of a semiconductor package to a cooling element.

A cap may provide a creeping distance between an exposed die pad and/or a lead of the semiconductor package and a cooling element when assembled to a semiconductor package system. A creepage distance is defined as shortest distance along a surface of a solid insulating material between two conductive parts. A required creeping distance depends on the voltage range in which the semiconductor package system is used and an environment in which the semiconductor package system is used. A creeping distance for semiconductor package systems as described herein may be in a range of 0.5 cm to 5 cm. The creeping distance may be in a range of about 1 cm to 2 cm.

A cap may provide a clearance distance between a lead of the semiconductor package and a cooling element when assembled to a semiconductor package system. A clearance distance is defined as the shortest distance in air between two conductive parts. A required clearance distance depends on the voltage range in which the semiconductor package system is used and an environment in which the semiconductor package system is used. A clearance distance for semiconductor package systems as described herein may be in a range of 1 mm to 10 mm. The clearance distance may be in a range of about 4 mm to 6 mm.

A thermal conductivity of the cap may be greater than 1 W/mK (Watt per meter Kelvin). A thermal conductivity of the cap may be about 10 W/mK. A thermal conductivity of the cap may be greater than 10 W/mK. A thermal conductivity of the cap may be greater than 40 W/mK. A thermal conductivity of the cap may be enhanced by thermally conductive filler particles. Filler particles may comprise the following materials: BN (boron nitride), Al2O3 (alumina), SiN (silicon nitride), SiO2 (silica), AlN (aluminum nitride), SiC (silicon carbide), BeO (beryllium oxide).

An electrically insulating material of the cap may comprise a thermo softening plastic. A thermo softening plastic may be brought into a moldable state by heating several times. A thermo softening plastic may comprise PPS (poly (p-phenylene sulfide), PEEK (polyether ether ketone), PC (polycarbonate), TPE (thermoplastic elastomer), LCP (liquid crystal polymer), PET (polyethylene terephthalate), PEI (polyetherimide), PPA (polyphthalamide), PA66 (polyamide), PE (polyethylene), PS (polystyrene), PMMA (poly (methyl methacrylate). An electrically insulating material may comprise a thermosetting plastic material. A thermosetting plastic may be molded only once and does not return to a moldable state afterwards. They are not re-moldable. A thermosetting plastic material may comprise an epoxy resin.

The electrically insulating material may comprise a glass transition temperature which is in-between a usual operation temperature of the semiconductor package and a soldering temperature used for attaching the semiconductor package to a board. A glass transition temperature is the temperature at which the so-called glass transition occurs. The glass transition temperature of a material is lower than the melting temperature. A glass transition is a reversible transition into an amorphous material state. The amorphous state may be a viscous state. The glass transition may be a smooth increase in viscosity of the material. While not being liquid the material softens. In the glass transition state the material can adapt to surrounding surfaces. E.g. a cap arranged between a semiconductor package surface and more specifically between an exposed die pad and a surface of a cooling element may adapt in the glass transition state to the two surrounding surfaces. Thus, any air bubbles or generally any entrapments between the semiconductor package and the cap and the cap and the cooling element may disappear.

A material having a glass transition temperature above the usual package temperature during operation may not undergo the glass transition during operation and a cap formed therefrom remains solid during operation. On the other hand, a glass transition temperature below the solder temperature leads to a glass transition during soldering. A cap formed from a material comprising a glass transition temperature below the solder temperature can adapt to the surface of the semiconductor package and the surface of an already mounted cooling element during the soldering process. Thus, the thermal interface between the semiconductor package and the cooling element may be improved.

The glass transition temperature may also be reached during operation of the component even if the glass transition temperature is above the usual package temperature during operation. This may happen if the contact between the semiconductor package and the cap and/or the cap and the cooling element is in the beginning not sufficiently good due to irregularities in the touching surfaces. The thermal interface may then have a high thermal contact resistance and the chip inside the semiconductor package may heat up the exposed die pad. In this case, the temperature of the die pad may heat the cap 12 so as to reach the glass transition temperature. In the glassy state the cap may adapt to the irregularities in the surfaces of the semiconductor package and the cooling element and thus the thermal interfaces may enhance. The semiconductor package may then be cooled down as intended by the cooling element. The temperature of the cap may descend below the glass transition temperature and the cap returns into the solid state.

Some filler particles may be provided so as to act as spacers between the semiconductor package and the cooling element during a glass transition phase. These filler particles may comprise a particle size of about two third of a minimal distance between the semiconductor package and the cooling element. The filler particles may comprise a particle size of about 50 to 90% of the minimal distance. Preferably, the filler particles may comprise a particle size of about 60 to 80% of the minimal distance. The minimal distance may be defined to guarantee a minimal electrical resistance or break-through-strength between the exposed die pad and the cooling element. The particle sizes may be about two third of the cap thickness. The particle sizes may be about 50 to 90% of the cap thickness. The particle sizes may be about 60 to 80% of the cap thickness. A spacer function of these greater particles may assure a correct electrical insulation between exposed die pad and cooling element.

A general particle size of the filler material may be less than one third of the cap thickness which defines the distance between the exposed die pad and the cooling element. The particle size of filler material may vary between about 1 μm to about 100 μm, preferably between about 30 μm to about 80 μm.

A material of the cap may further comprise flame retardants. Flame retardants may comprise Mg(OH)2 (magnesium hydroxide), Al(OH)3 (aluminium hydroxide) and Sb2O3 (antimony(III) oxide). The flame retardants material may comprise Br (bromine) containing further flame retardants. Further filler particles may comprise material of a defined very low electrical conductivity for reducing the risk of partial discharge at micro voids. These fillers may comprise e.g. carbon.

An outer circumference of the cap may be adapted to a semiconductor package. Dimensions of the cap may be about 20 mm×17 mm. More specifically, for a TO247 package cap dimensions may be 21.7 mm×16.7 mm. An outer circumference of the cap may be greater than the semiconductor package, the cap may project by a flange over the semiconductor package. A flange may enhance a creepage distance and a clearance distance.

A cap may comprise a cap body part configured to cover, at least partly, a main surface of the semiconductor package. The cap body part may have generally the form of a sheet. A rim may run along an outer circumference of the cap body or cap body part. The outer circumference of the cap body may correspond to the outer circumference of the semiconductor package. The rim may reach around the semiconductor package. The rim may enhance a creepage distance.

A cap may further comprise a fastening system. A fastening system is also referred to as attaching means throughout this application. The fastening system may be a clip. A fastening system may engage around at least a part of the semiconductor package. A fastening system may engage into at least one opening of the semiconductor package.

The cap body may comprise a through-hole adapted to a through-hole in the semiconductor package. The through-holes may allow a screw to pass through the through-holes to hold together an arrangement comprising a cooling element, a cap and a semiconductor package.

A thickness of the cap body may be comprised between about 10 μm (micrometer) up to several 100 μm. A thickness of the cap body may be between about 30 μm and about 600 μm. In an embodiment the thickness of the cap body may be between about 100 μm and about 500 μm. A thickness of the cap body may be between 250 μm and about 300 μm. A thickness of the cap body may be 300 μm. A thickness of the cap body may be about 1 cm. A thickness of the cap body may depend on a required clearance distance between a lead and a cooling element. A thickness of the cap body may depend on a required creepage distance between an exposed die pad and a cooling element.

The cap body may comprise a base directed towards the semiconductor package. The base may have an outline which is smaller or equal the outline of the semiconductor package. The base may have an outline which is smaller or equal the outline to the outline of the exposed die pad surface.

The cap body may comprise in addition to the base a flange which projects over a circumference or outline of the semiconductor package. The flange may project essentially parallel to a main face of the semiconductor passage. A combination of base and flange may enhance creepage distance and/or clearance distance.

The cap body may comprise a recess accommodating at least partly the encapsulation body.

A cap may comprise a fastening system with one attachment means. A fastening system may engage around or span a semiconductor package from only one side. A cap may comprise two or more attachment means arranged on two or more sides of the semiconductor package. A cap may be essentially rectangular. A cap may comprise two attachment means on opposite sides of the rectangular cap body. A cap may comprise three attachment means on different sides of the rectangular cap body. A cap may comprise four attachment means. The four attachment means may be arranged by two, two of each arranged on two opposite sides of the rectangular cap body. A cap may comprise four attachment means arranged on four sides of the rectangular cap body. The attachment means may be clips.

The fastening system may be configured to engage around part of the semiconductor package, thereby fixing the cap to the semiconductor package. The fastening system or attachment means may comprise a first part extending from the cap body along a side surface of the semiconductor package. The attachment means may comprise a second part connected to the first part at the side opposite the cap body. The second part may comprise a contact face directed towards the cap body. A distance between the contact face and the cap body may be configured so as to clamp the at least part of the semiconductor package between the cap body and the contact face.

The attachment means may be configured to reach around the semiconductor package so as to span the whole thickness of the semiconductor package. The contact face then contacts the opposite main surface of the semiconductor package. The attachment means or fastening system may be adapted to an indentation comprised in the semiconductor package. An indentation may be provided due to technical needs during the encapsulation process encapsulating the chip in the semiconductor package, as for example in the case of a TO package. This indentation may be arranged on two opposite sides of the semiconductor package. In this case, the contact face may contact a surface in the indentation opposite the package surface on which the exposed die pad is arranged. The attachment means may be adapted to a projection or to a notch comprised in a side surface of the semiconductor package. The projection or the notch may extend over part of the side surface or over the whole length of the side surface. The contact face may then contact a surface of the projection or of the notch opposite the package surface on which the exposed die pad is arranged. In a case where the attachment means reach around the whole package thickness, a distance between the cap body and the contact face may be about 5 mm. In the case where the attachment means are adapted to an indentation, a projection or a notch the distance between a contact face and the cap body may be about 2 mm. Generally, the distance between a contact face and the cap body may be adapted to the semiconductor package. In the case where the attachment means are adapted to an indentation the attachment means may have a width of about 3 mm. In the case the attachment means are adapted to span the whole thickness of the semiconductor package or in the case the attachment means are adapted to a projection or a notch, the attachment means may have a greater width. They may be as wide as to reach along the whole width of the semiconductor package.

Alternatively or additionally, a fastening system may engage into at least one opening of the semiconductor package. The opening may be arranged on a side or on more than one side of the semiconductor package. The fastening system may engage into the opening in a form fit manner.

The cap may be attached to the semiconductor package to form a semiconductor package system by the user prior to soldering the semiconductor package to a circuit board. The cap may be attached to the semiconductor package to form a semiconductor package system after producing the semiconductor package in the factory. The cap may be manufactured separately from the semiconductor package. The cap may be attached to the semiconductor package only in cases where an electrically insulated mounting and cooling is required. The attachment means or fastening system may be sufficiently flexible to allow a slight deflection of the attachment means when mounting. In an embodiment, the cap may be mounted by a movement which is essentially vertical to a main surface of the semiconductor package. The attachment means may be deflected when coming into contact with the semiconductor package and then snap into place providing a snap connection. The attachment means may remain stiff and enter by a movement which is essentially vertical to a main surface of the semiconductor package into adapted openings.

In a further embodiment, the cap may be mounted by a movement which is essentially horizontal to a main surface of the semiconductor package. The attachment means may slide along side surfaces of the semiconductor package to come into place providing a matched joint connection. The cap may be produced by injection molding of a cap in a mold form. Injection molding is a method allowing mass production at low cost.

The cap may be attached to the semiconductor package to form a semiconductor package system by the user after soldering the semiconductor package to a circuit board. A solder process may thus not influence the cap. A high solder temperature may not alter the cap.

A cap may comprise in addition to the plastic material a plate of an electrically conductive material. The electrically conductive material may be arranged at a surface of the cap opposite the side of the semiconductor package. The electrically conductive material may be attached to the plastic cap body of the cap during the process of injection molding. In this case a layer of the electrically conductive material may be placed in the mold form prior to injection molding the electrically insulating material to form the cap. The electrically conductive material may comprise metal. The electrically conductive material may comprise an aluminum plate. By incorporating a metal plate in the cap, the cap itself already comprises a kind of small heat sink. Using aluminum allows for a light weight heat sink.

It may be an advantage that the cap, acting as a thermal interface, may be mounted directly to the semiconductor package without the need of an adhesive or a grease. It may be a further advantage, when using a thermo softening material with a glass transition temperature as outlined above, that the cap adapts to a surface of the semiconductor package and/or to a surface of a cooling element. It may be an advantage that the cap is easily mounted to a semiconductor package after soldering the semiconductor package to a circuit board.

Although embodiments described hereafter show the cap mounted to the semiconductor package it is to be understood that the cap may also be mounted on the cooling element.

Figure 1B:
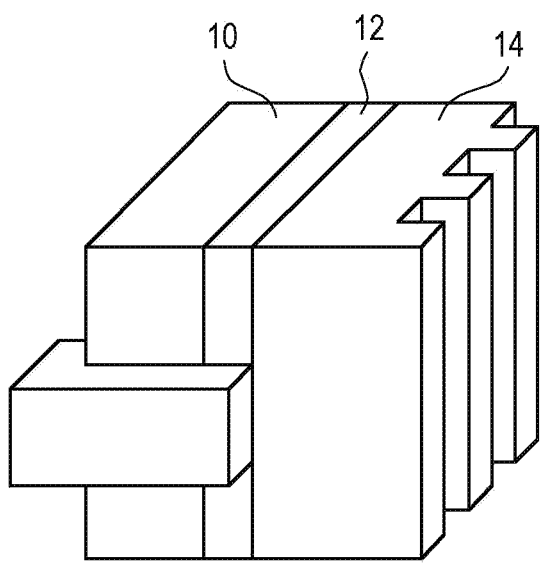

FIGS. 1A and 1B illustrate schematically an arrangement comprising a semiconductor package 10, a cap 12 and a cooling element 14. In FIG. 1A the semiconductor package 10, the cap 12 and the cooling element 14 are separated from each other. In FIG. 1B cap 12 is mounted on semiconductor package 10 to form a semiconductor package system. Cooling element 14 is arranged next to cap 12. It is to be understood that an arrangement may also comprise only semiconductor package 10 and cap 12, i.e. the semiconductor package system.

Semiconductor package 10 may comprise an exposed die pad 16 and an encapsulation body 17. The exposed die pad 16 may be arranged on a main surface 18 of semiconductor package 10. Semiconductor package 10 may comprise a second main surface 20 which is opposite the first main surface 18. Semiconductor package 10 may have side surfaces 22 which join the main surfaces 18 and 20. Semiconductor package 10 may have a thickness t which corresponds to a distance between the first main surface 18 and the second main surface 20. Semiconductor package 10 may comprise external terminals which are not shown in FIG. 1A. Dependent on the kind of semiconductor package these external terminals may be leads arranged on one surface of the semiconductor package, on two opposite side surfaces of the semiconductor package or also on four side surfaces of the semiconductor package. In the case of a leadless semiconductor package the external terminals may be arranged on a main surface of the semiconductor package 10. Semiconductor package 10 may enclose one or more semiconductor chips which are not shown in FIG. 1A. A semiconductor chip may be mounted on a surface of die pad 16 opposite the exposed surface and not visible in FIG. 1A.

Cap 12 may comprise attachment means of a fastening system 24 which may be configured to engage around the thickness t of semiconductor package 10. Cap 12 is shown with one attachment means only. This is not to be understood in a limiting sense. Cap 12 may also comprise two attachment means, e.g. on opposite sides of the cap. Cap 12 may also comprise four attachment means, e.g. one on each side of cap 12. Cap 12 may also comprise another number of attaching means. Cap 12 may comprise attachment means which are configured to engage into an opening in semiconductor package without engaging around a part of semiconductor package 10.

Cap 12 may further comprise a cap body or cap body part 26. Cap body 26 may be configured to cover a main surface of semiconductor package 10. In the example shown in FIG. 1A, the cap body 26 covers completely the main face 18 of semiconductor package 10. In other embodiments the cap body may be smaller or somewhat larger than the main surface 18. The cap body 12 may be at least as large as the exposed cooling surface or exposed die pad 16.

The attachment means 24 may comprise a first part 28 which extends from the cap body 26 along a side surface of the semiconductor package 10. The first part 28 may be essentially straight. The attachment means 24 may further comprise a second part 30 which is attached to the first part at a side opposite cap body 26. The second part 30 may comprise a contact face 32 which is directed towards cap body 26, or in other words, the contact face 32 may face a main surface of cap body 26. A distance between the contact face 32 and a main surface of cap 12 may correspond to thickness t of semiconductor package 10. The distance between contact face 32 and a surface of cap body 26 is configured so as to clamp the semiconductor package 10 between the cap body 26 and the contact face 32. The contact face 32 may contact the encapsulation body. The contact face 32 may contact a leadframe or part of a leadframe.

The cap 12 may be formed from electrically insulating material as discussed above. The electrically insulating material may comprise filler particles as discussed above to enhance thermal conductivity. The cap 12 may provide a thermal interface between the exposed die pad 16 of semiconductor package 10 and the cooling element 14.

Cooling element 14 may comprise an essentially flat surface which is not visible in FIG. 1A and which is directed towards the cap 12. The cooling element 14 may further comprise cooling fins 34 directed towards a side opposite cap 12. Fins 34 may be configured to allow for good heat dissipation. Cooling element 14 may be formed from metal.

FIG. 1B shows the semiconductor package 10, the cap 12 and the cooling element 14 attached to each other. The attachment means 24 reach around a side surface 22 of semiconductor package 10. The contact face 32 fixes securely the cap 12 to the semiconductor package 10. The cooling element 14 may be fixed to the cap by any means. In an embodiment there may be a clamp reaching around the semiconductor package and the cooling element. In a further embodiment there may be a screw reaching through the cooling element 14, the cap 12 and the semiconductor package 10. FIG. 1B does not show how cooling element 14 and semiconductor package 10 are hold together. Attachment by screws or clamps is known to the person skilled in the art. In an embodiment the cooling element 14 may be attached to a circuit board.

Once the arrangement comprising semiconductor package 10, cap 12 and cooling element 14 assembled, the arrangement may be heated above a glass transition temperature of the electrically insulating material of cap 12. In its glass transition state the cap 12 may become viscose and may adapt to any irregularities of either the semiconductor package and/or the cooling element.

Figure 2A:
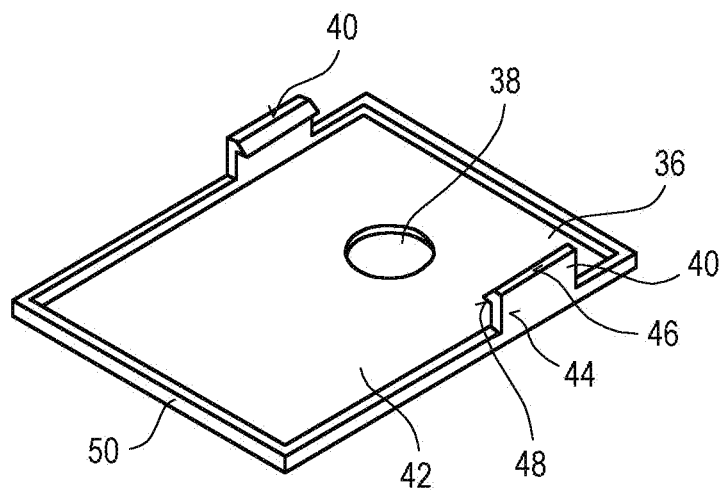
FIGS. 2A to 2C illustrate schematically an exemplary cap, the cap attached to a semiconductor package and a detail of an exemplary fastening system in an example for a TO247 package.
Figure 2B:
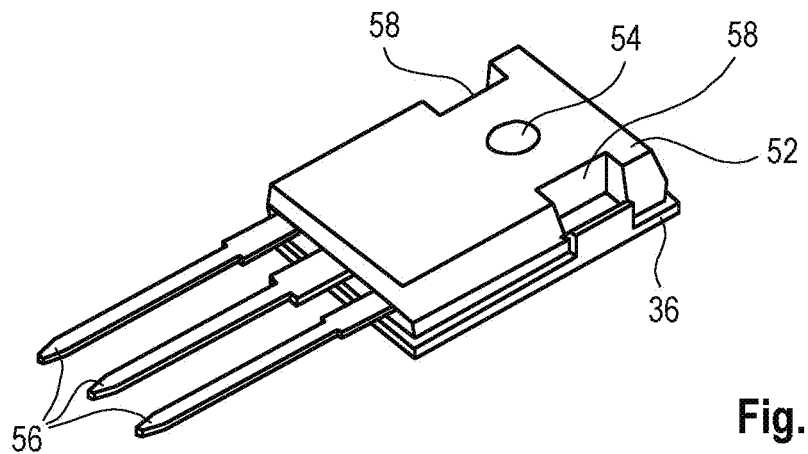
Figure 2C:
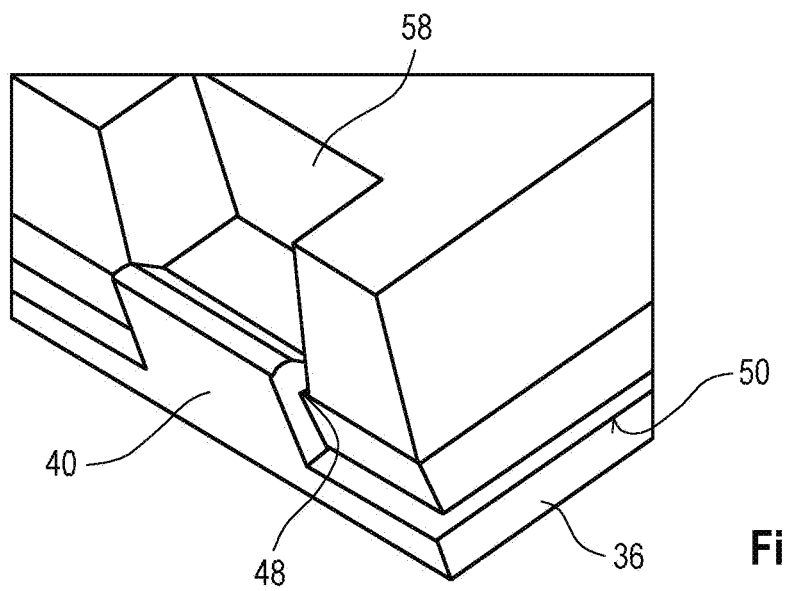

FIGS. 2A to 2C show an embodiment with a cap adapted to a TO semiconductor package for a through-hole mounting.

FIG. 2A shows a cap 36. The cap 36 may be formed by any of the above discussed electrically insulating materials. The cap 36 may comprise any of the above discussed filler elements. Cap 36 may comprise a through-hole 38. The through-hole 38 may be adapted to a through-hole comprised in the TO package for which the cap 36 is intended.

Cap 36 may further comprise two attachment means 40 and a cap body 42. The two attachment means 40 may be arranged on opposite sides of cap body 42. They may each comprise a first part 44 extending from the cap body 42 and a second part 46 comprising a contact surface 48. A rim 50 may be arranged around a circumference of cap body 42. Cap body 42 may be essentially rectangular. Cap body 42 may be adapted to a main surface of the TO semiconductor package. Rim 50 may be adapted to reach around the main surface of the semiconductor package.

FIG. 2B shows a TO247 semiconductor package 52. The TO247 package 52 may comprise a through-hole 54. The semiconductor package 52 may further comprise leads 56 adapted for mounting the semiconductor package 52 onto a circuit board.

FIG. 2B shows the cap 36 mounted on semiconductor package 52 to form a semiconductor package system. Semiconductor package 52 may comprise two indentations 58. Indentations 58 may be provided on semiconductor package 52 for manufacturing reasons. Indentations 58 may be provided on the TO247 package 52 for fixing the leadframe during an encapsulation process of the package. Indentations 58 may also be formed deliberately to hold the cap 36 on the package 52. As can be seen in FIG. 2B the attachment means 40 may be adapted to a part of the semiconductor package 52 and, more specifically, to the base of the indentations 58 or in other words to the part closing the indentations 58 on one side of semiconductor package 52. The first part 44 of the attachment means 40 may be adapted to the thickness of the indentation base. The contact surface 48, which is not visible in FIG. 2B, may contact the semiconductor package indentation base and the attachment means 40 may clamp between the indentation base and a main surface of the semiconductor package.

FIG. 2C shows in more detail the indentation 58 and the attachment means 40 reaching around the base of the indentation. The contact surface 48 of the second part 46 of the attachment means 40 faces the base of the indentation and reaches into the indentation. Thus, the cap 36 may be clamped between a surface of the base of the indentation and a main surface of the semiconductor package 52 which is in the illustration of FIG. 2C on the bottom-side of the package.

As can be seen in FIG. 2C, the rim 50 may reach around the semiconductor package. An advantage of rim 50 may be to provide a greater distance for a possible leakage current. In another word, rim 50 may provide a longer creepage distance starting from the exposed die pad around the cap to the cooling element. Dimensions of cap 36 may be about 21.7 mm×16.7 mm to adapt to a classical TO247 semiconductor package. A thickness may be of about 300 μm.

Figure 3A:
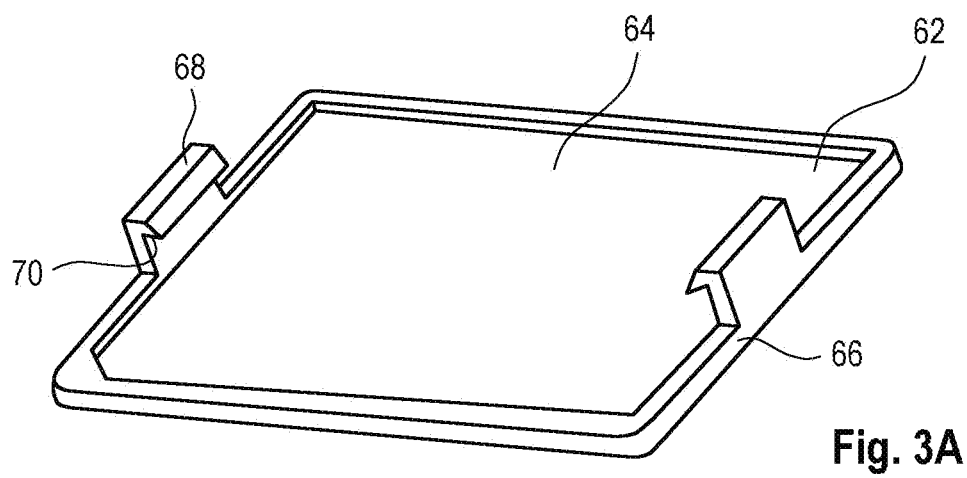
FIGS. 3A to 3C illustrate schematically an exemplary cap, the cap attached to a semiconductor package and a detail of an exemplary fastening system in an example for a DSO package with bottom-side cooling.
Figure 3B:
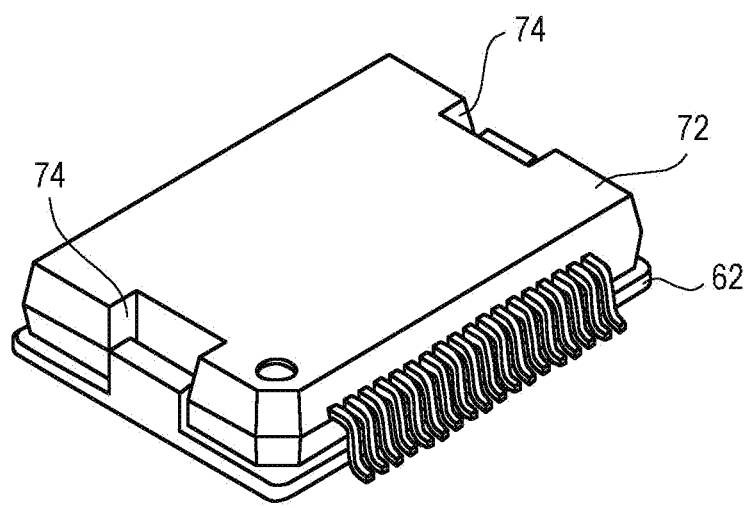
Figure 3C:
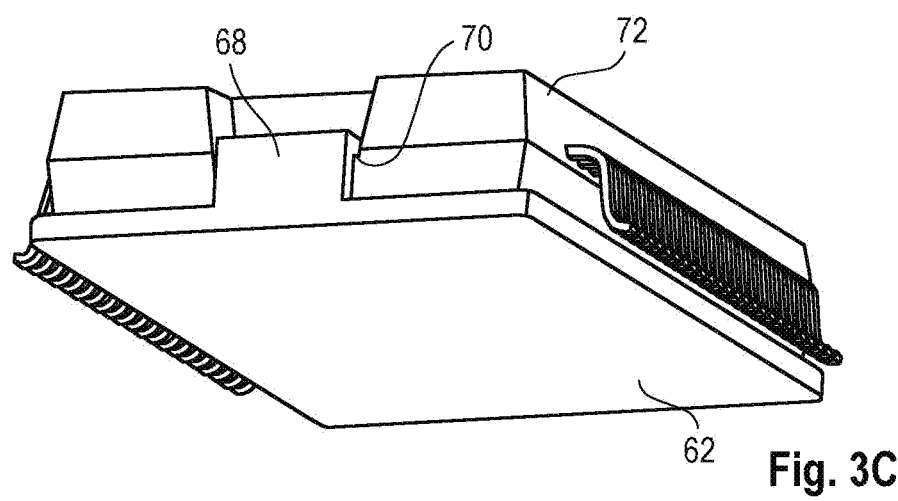

FIGS. 3A to 3C show a semiconductor package system comprising a cap and a DSO semiconductor package with a bottom-side cooling.

FIG. 3A shows a cap 62 comprising a cap body 64, a rim 66 and two attachment means 68 forming a fastening system. Cap 62 may not comprise a through-hole because the DSO package, for which cap 62 is configured, does not comprise a through-hole. The dimensions of cap 62 may be adapted to the DSO package so that the rim 66 may surround the package and extend over side surfaces of the package. The attachment means 68 may comprise a first part adapted to the part of the semiconductor package which is used for clamping the cap 62 to the semiconductor package 72 and a second part comprising a contact face 70.

FIG. 3B shows the semiconductor package system comprising the semiconductor package 72 and the mounted cap 62. The DSO package 72 may comprise leads on two opposite sides of the package. Only the leads on one side are shown. The semiconductor package 72 may comprise two indentations 74. For the indentations 74 the same as explained above for indentations 58 is applicable. The attachment means 68 may reach around a base of the indentation 74 and the contact face 70 may face the base of the indentation.

FIG. 3C shows the semiconductor package system comprising the cap 62 and the semiconductor package 72 from below. One of the attachment means 68 is visible in FIG. 3C. The contact face 70 clamps the semiconductor package 72 between the contact face 70 and the cap body 64 of the cap 62 by engaging around the base of the indentation.

Figure 4:
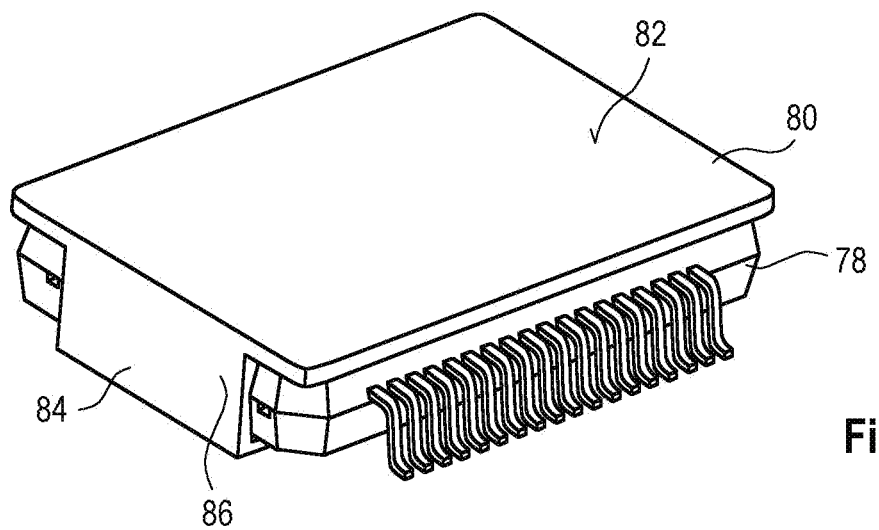
FIG. 4 illustrates an exemplary cap mounted on a semiconductor package in an example for a DSO package with top-side cooling.

FIG. 4 shows a further embodiment. A semiconductor package system comprises a semiconductor package 78 and a cap 80. The semiconductor package may be a DSO package with top-side cooling. A cap body 82 of cap 80 may be adapted to an outer dimension of the DSO package 78 and may be arranged on the top of the semiconductor package 78. In the example shown, the semiconductor package 78 does not comprise an indentation. Attachment means 84 of cap 80 may be configured to reach around the whole thickness of semiconductor package 78. Attachment means 84 may comprise a first part 86 starting at cap body 82 and having a length adapted to the overall thickness of semiconductor package 78. A second part of attachment means 84 may comprise a contact face and extend under the semiconductor package 78. Semiconductor package 78 may be clamped between the contact face of the second part of the attachment means 84 and the cap body 82. Although not visible in FIG. 4, cap 80 may comprise a second attachment means on the side opposite of the first attachment means and configured in the same way as the first attachment means 84.

Figure 5A:
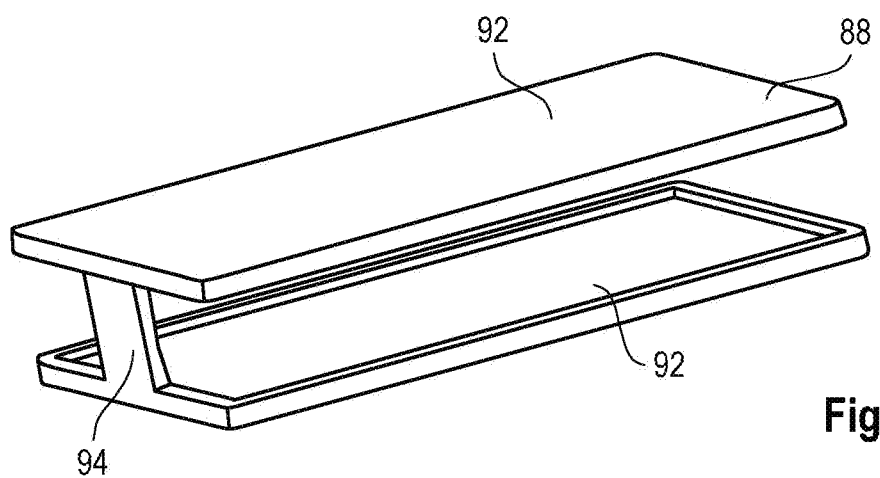
FIGS. 5A and 5B illustrate schematically an exemplary cap and the cap attached to a semiconductor package for an exemplary DSO package with double-sided cooling.
Figure 5B:
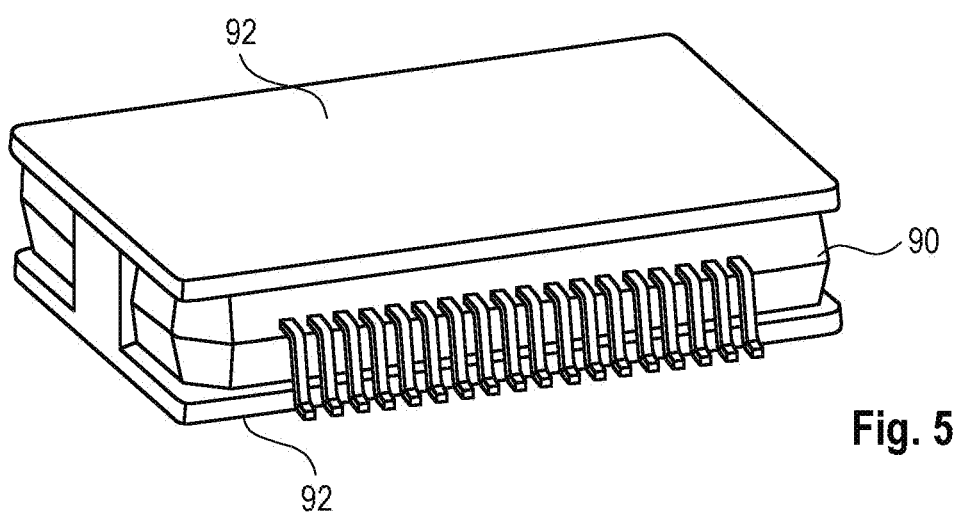

FIGS. 5A and 5B show a further embodiment. FIG. 5A shows a cap 88 configured for a double-sided cooling semiconductor package 90. The double-sided cooling semiconductor package may be a DSO package. The cap 88 comprises two cap bodies 92. Each of the two cap bodies 92 may comprise a rim as explained above. In embodiments only one of the cap bodies 92 may comprise a rim. The cap 88 may further comprise attachment means 94. A first part of the attachment means may be adapted to a thickness of semiconductor package 90. A second part of the attachment means 94 is formed by one of the two cap bodies 92.

FIG. 5B shows cap 88 mounted to semiconductor package 90 to form a semiconductor package system. The semiconductor package 90 is clamped between the two cap bodies 92, one of the two cap bodies corresponding to a cap body as explained in the embodiments above and the second cap body may provide a contact face as explained in the embodiments discussed above. Two cooling elements may be mounted to the arrangement in FIG. 5B. For example, one cooling element may be comprised in a circuit board to which package 90 is to be mounted and a second cooling element may be attached on top of the semiconductor package 90 with the cap body 92 as thermal interface between the cooling element, which is not shown in FIG. 5B, and the semiconductor package 90.

Figure 6A:
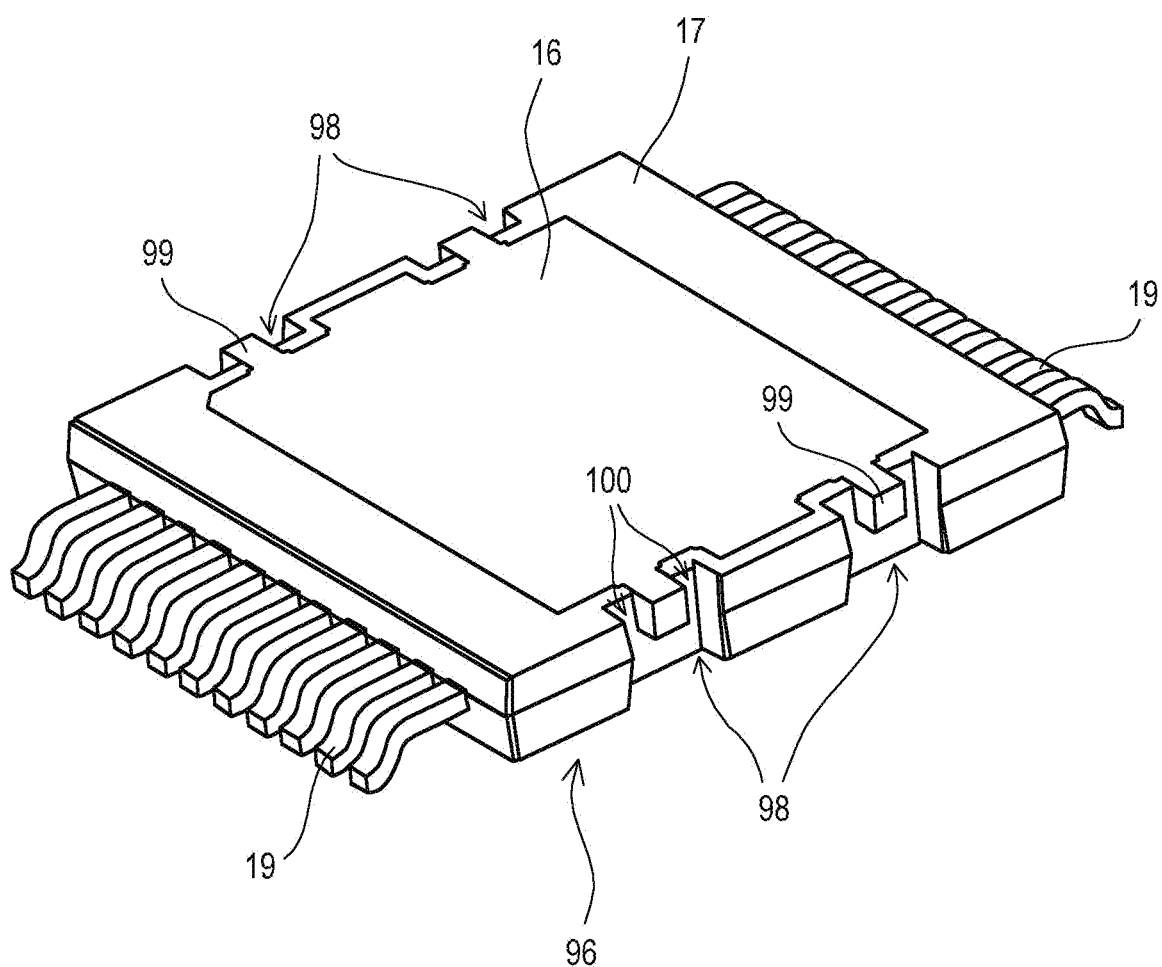
FIGS. 6A to 6E illustrate schematically a semiconductor package, two exemplary caps according to two embodiments and the caps respectively attached to the semiconductor package for another exemplary DSO package with top-side cooling.

FIGS. 6A to 6E show further embodiments. FIG. 6A shows a semiconductor package 96. Semiconductor package 96 may be a QDPAK (Quadruple Decawatt Package) for surface mounting for top-side cooling. Semiconductor package 96 may comprise an exposed die pad 16 and an encapsulation body 17. Leads 19 may be arranged at two opposite sides of semiconductor package 96.

On the other two opposing sides of semiconductor package 96 encapsulation body 17 may comprise indentations 98 extending from the upper main side of semiconductor package 96 to the lower main side. Each side of semiconductor package 96 may comprise two indentations. In each indentation 98 a protrusion 99 from the exposed die pad 16 may project. The protrusion 99 may be a land of a lead frame comprising the die pad 16. Seen from the upper side of semiconductor package 96 each protrusion 99 may form with walls of the indentations 98 two openings 100.

Figure 6B:
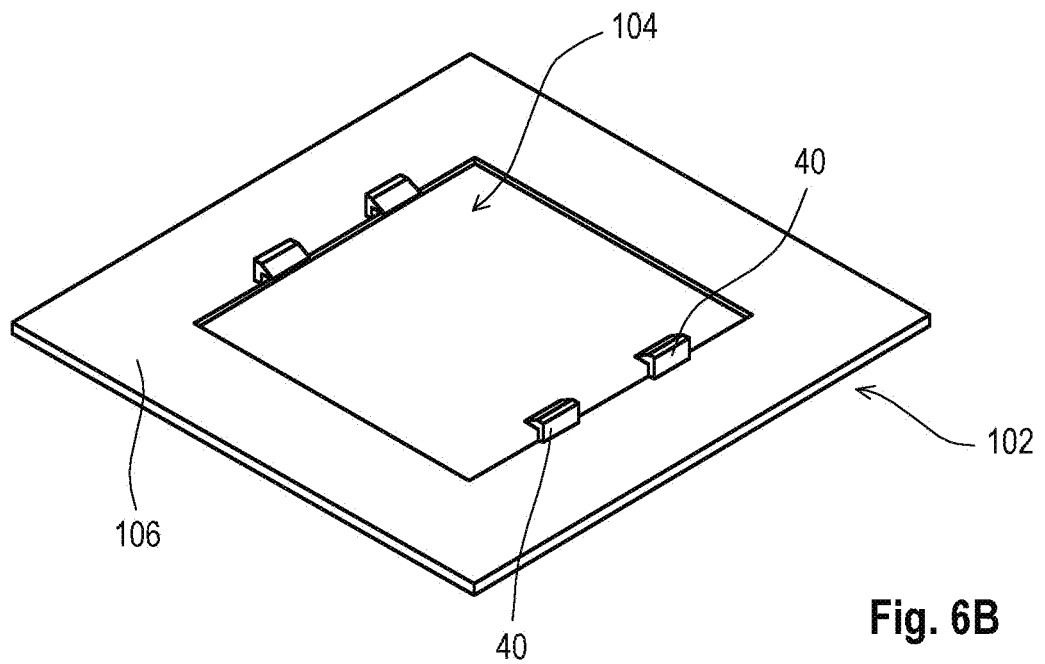

FIG. 6B shows a first exemplary cap 102 configured to be fastened to semiconductor package 96. Cap 102 may comprise four attachment means 40 as described with reference to FIG. 2A. Cap 102 may comprise a recess 104 adapted to an outer contour of semiconductor package 96. A flange 106 borders recess 104.

Figure 6C:
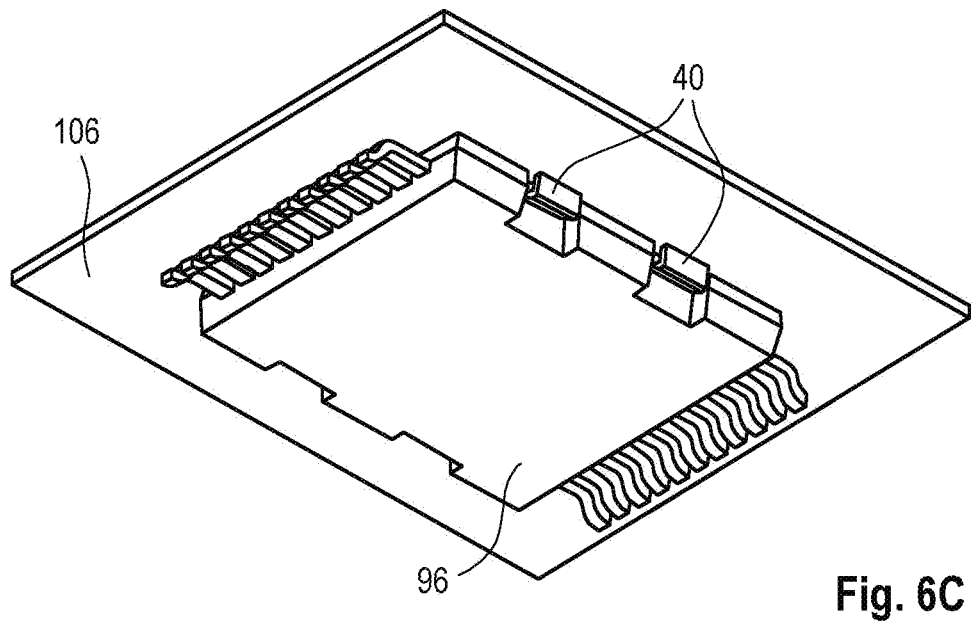

FIG. 6C shows from a down-side, i.e. from a circuit board side semiconductor package 96 with cap 102 mounted thereto. Flange 106 projects over the outline of semiconductor package 96. Flange 106 augments a creepage distance between the exposed die pad 16 (not shown in FIG. 6C) and a cooling element to be mounted on the other side of cap 102. Flange 106 augments a clearance distance between the leads of semiconductor package 96 and the cooling element.

Figure 6D:
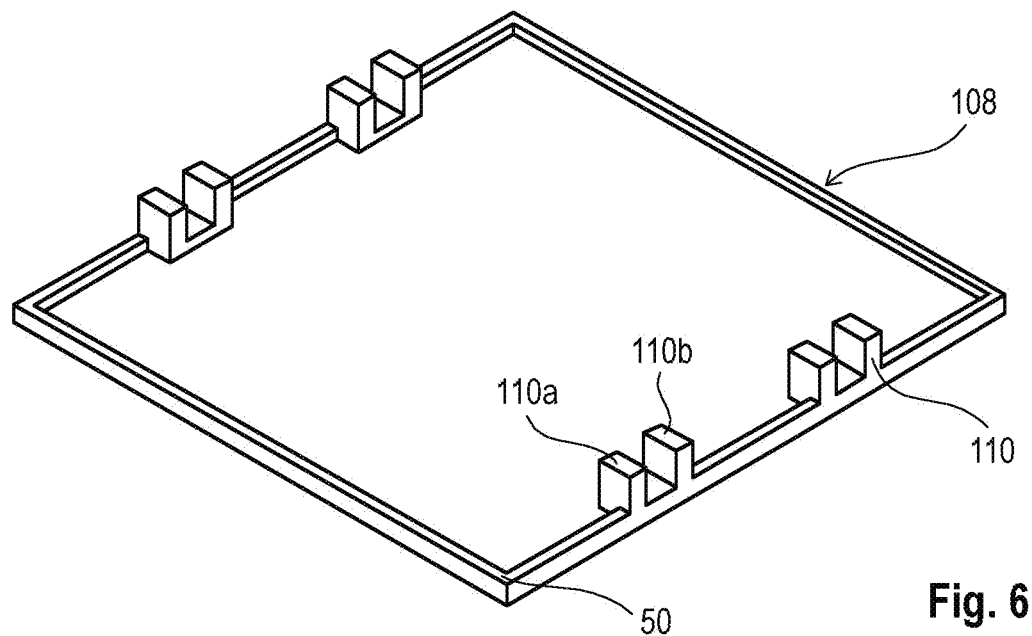

FIG. 6D shows a second exemplary cap 108 configured to be fastened to semiconductor package 96. Cap 108 may comprise four attachment means 110. Cap 108 may comprise a rim 50 as explained with reference to FIG. 2A adapted to an outer contour of semiconductor package 96.

Attachment means 110 may comprise two protrusions 110a and 110b each. Protrusions 110a, 110b may be bar-shaped. Protrusions 110a, 110b may be adapted to openings 100 formed in semiconductor package 96 (FIG. 6A).

Figure 6E:
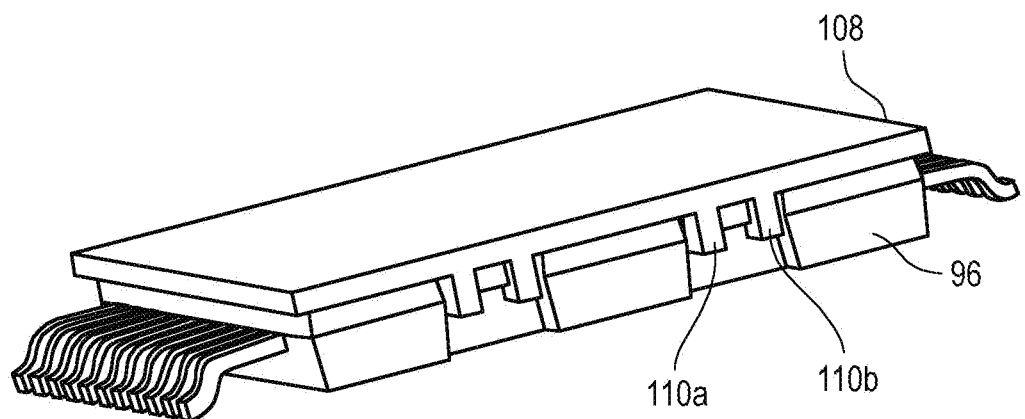

FIG. 6E shows in a side view semiconductor package 96 with cap 108 mounted thereto. Protrusions 110a, 110b may engage openings 100 formed by protrusions 99 and indentations 98. Rim 50 augments a creepage distance between the exposed die pad 16 (not shown in FIG. 6E) and a cooling element to be mounted.

It is to be understood that although 4 attachment means 40, 110 are shown for caps 102 and 108, other embodiments may comprise only two attachment means each, preferably arranged diagonally opposite or any other configuration.

Figure 7A:
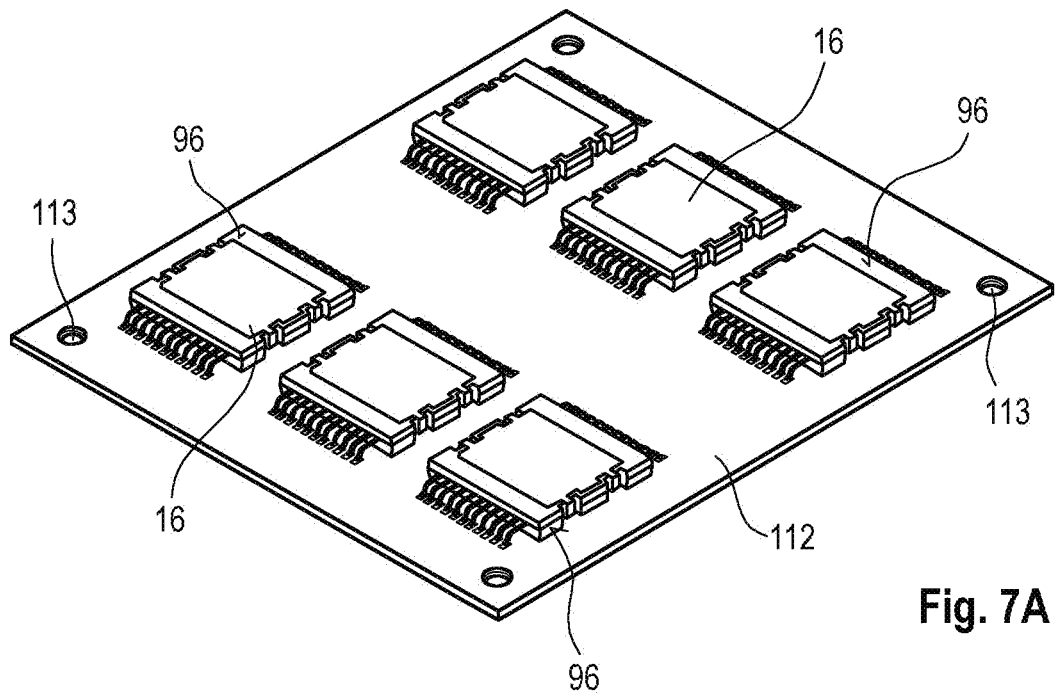
FIGS. 7A-7D illustrate schematically a board with six semiconductor packages soldered thereto and provided with respective exemplary caps according to two embodiments and a common heat spreader.

FIGS. 7A to 7D demonstrate an exemplary use of caps 102 and 108. FIG. 7A shows a circuit board 112. Circuit board 112 may be rectangular. Circuit board 112 may comprise four through-holes 113, one in each corner. Six semiconductor packages 96 may be soldered thereto. It is to be understood that the number of six packages is purely exemplary and any number of semiconductor packages may be soldered to circuit board 112. As explained with reference to FIG. 6A, each semiconductor package 96 may comprise an exposed die pad 16 on its upper surface.

Figure 7B:
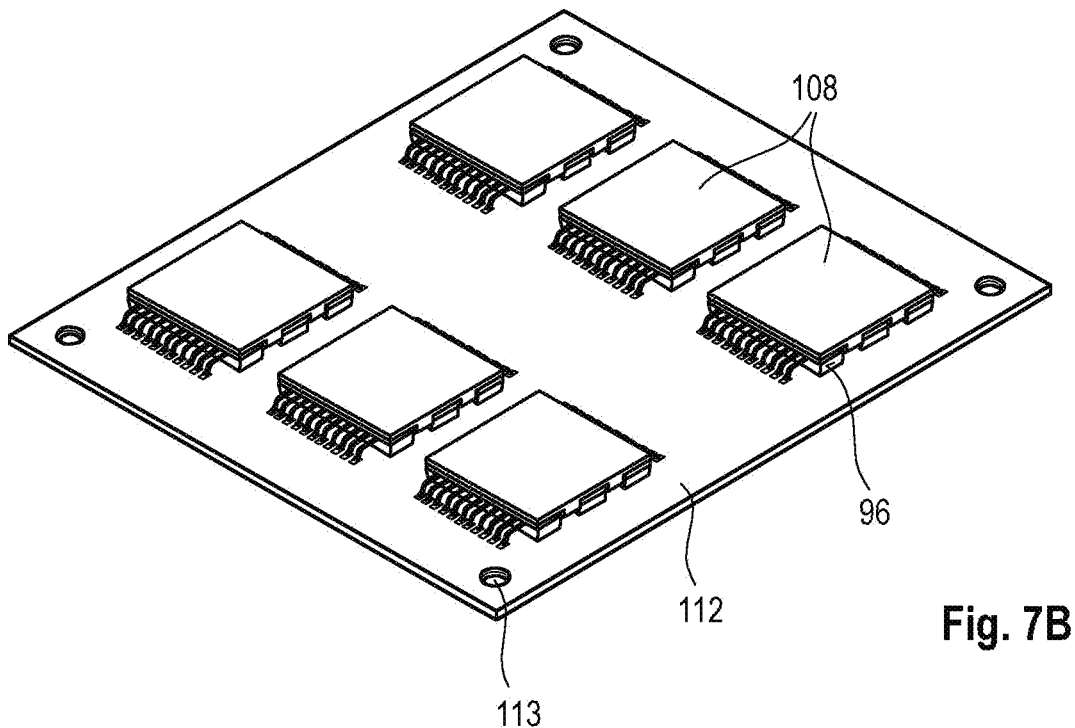

FIG. 7B shows the circuit board 112 of FIG. 7A with a cap 108 according to FIG. 6D fastened to each of semiconductor packages 96. Caps 108 may provide a thermal interface. Caps 108 may electrically insulate exposed die pads 16. Rim 50 may augment a creepage distance.

Figure 7C:
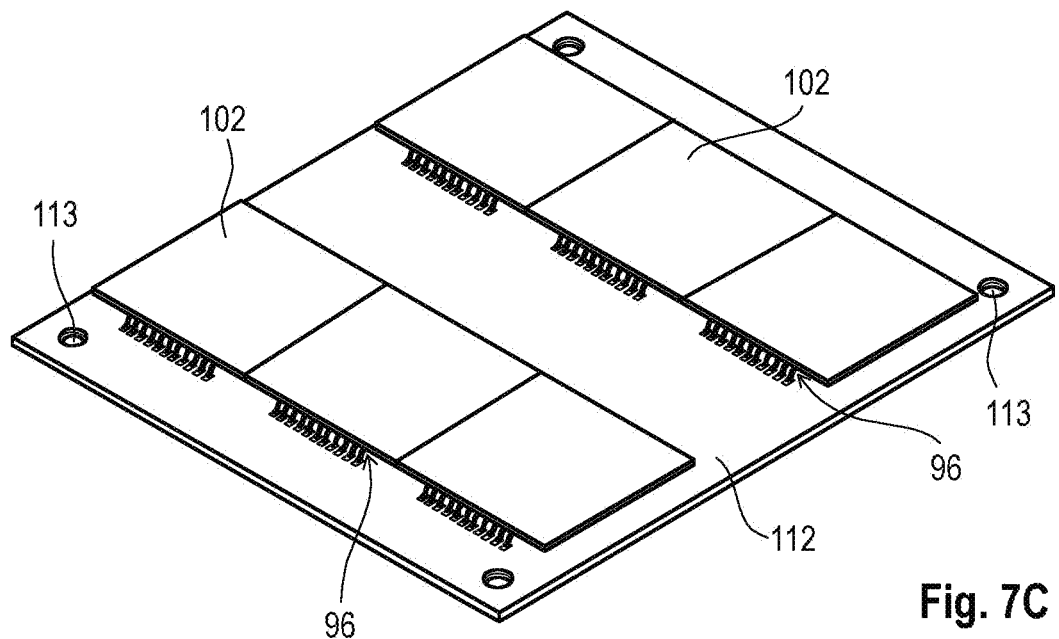

FIG. 7C shows the circuit board 112 of FIG. 7A with a cap 102 according to FIG. 6B fastened to each of semiconductor packages 96. Caps 102 may provide a thermal interface. Caps 102 may electrically insulate exposed die pads 16. Flange 106 together with recess 104 may augment a creepage distance. Flange 106 may augment a clearance distance.

It is to be understood that caps 102 and 108 may be fastened to semiconductor packages 96 after a solder process soldering semiconductor packages 96 to circuit board 112. Alternatively, caps 102, 108 may be fastened to semiconductor packages 96 before a solder process.

Figure 7D:
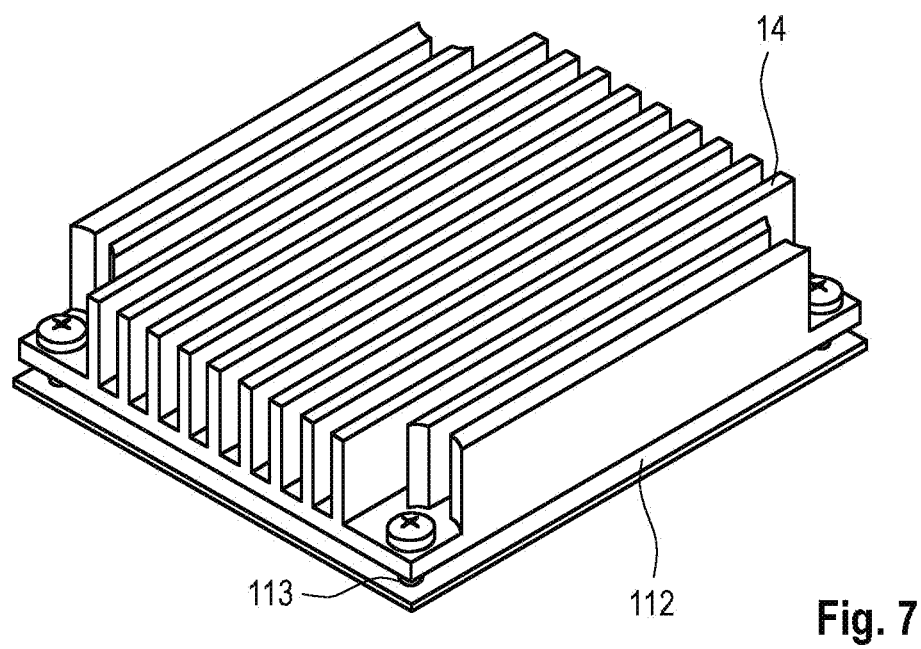

FIG. 7D shows the circuit board 112 of FIG. 7B or 7C, i.e. with caps 102 or 108 fastened, with a cooling element 14. Cooling element 14 may cover all six semiconductor packages 96 which are mounted to circuit board 112. Cooling element 14 may be fixed to circuit board 112 by screws using through-holes 113.

Figure 8:
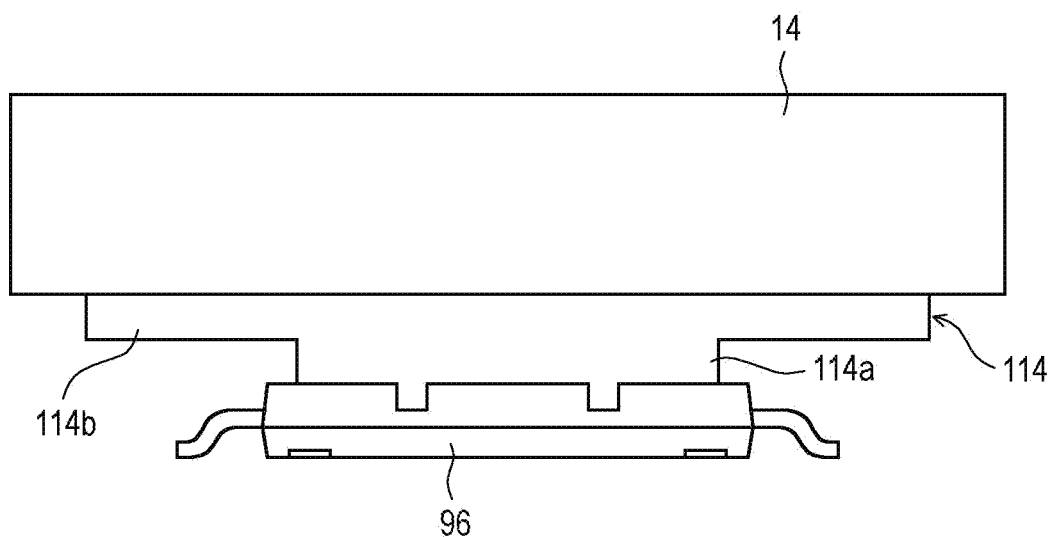
FIG. 8 illustrates schematically in a cross section an exemplary semiconductor package system comprising a semiconductor package, an exemplary cap and a heat spreader.

FIG. 8 shows in a schematic side view a semiconductor package system. On an upper side of a semiconductor package 96 a cap 114 may be fastened. A cooling element 14 may be mounted on top of cap 114. Cap 114 may comprise a cap body which is essentially box-shaped. The cap body may comprise a base 114a. Base 114a may have an outline smaller or equal the outline of the semiconductor package 96. Base 114a may have an outline adapted to an outline of exposed die pad 16. Base 114a may only cover exposed die pad 16 and not the encapsulation body 17. The cap body may comprise a surrounding flange 114b projecting over a circumference of the box shape. The flange 114b may project essentially parallel to a main face of the cap body. Cooling element 14 may have an outline greater than flange 114b. Cooling element 14 may project over an outer shape of the cap body of cap 114.

Cap 114 may have a thickness configured to further augment a clearance distance. A chip comprised in semiconductor package 96 may e.g. operate in a voltage range of about 1500 Volts to 1900 Volts. A thickness of cap 114 may then be in a range of about 1 cm. A thickness of cap 114 may be smaller than 1 cm. A thickness of cap 114 may be adapted to the clearance distance required.

Figure 9A:
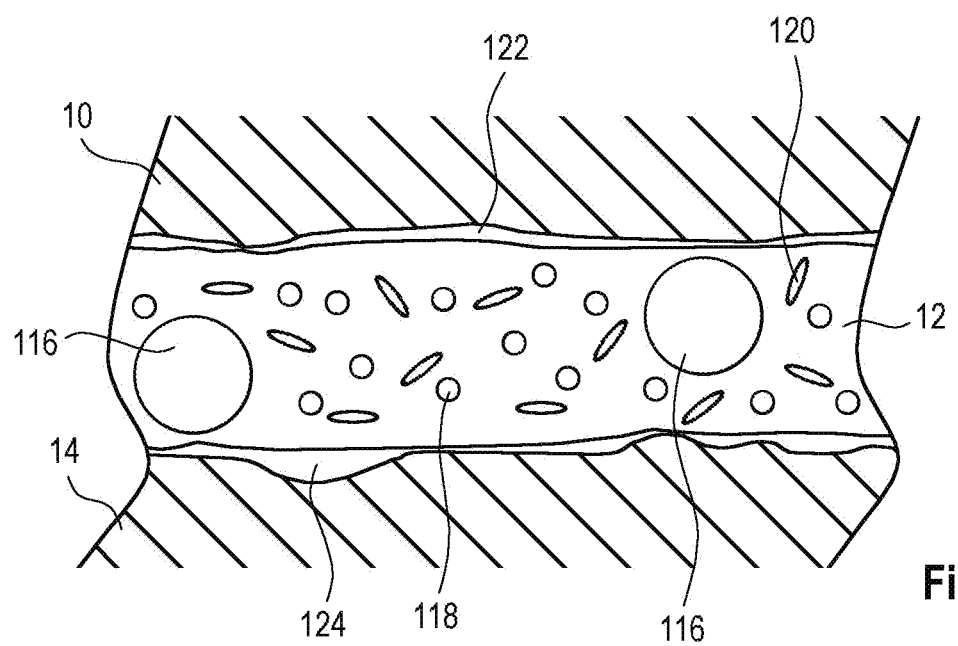
FIGS. 9A and 9B illustrate schematically a cross-section through an exemplary cap before and after heating the cap.
Figure 9B:
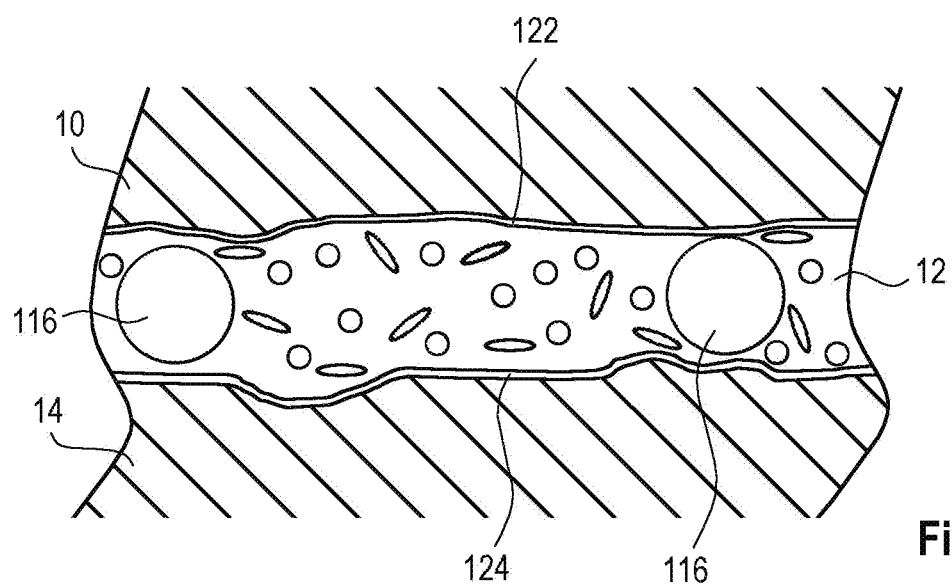

FIGS. 9A and 9B show an exemplary cap 12 between a semiconductor package 10 and a cooling element 14 in a cross-section. It is to be understood that this may be the cross-section of any of the caps shown in the FIGS. 1 to 5. This may be as well any other cap as discussed in the disclosure.

Cap 12 comprises an electrically insulating material as discussed above. As shown in FIGS. 9A and 9B cap 12 may further comprise filler particles 116, 118 and 120. Filler particles 116, 118, 120 material may be any of the filler materials discussed above. Exemplary, filler particles 116 and 118 are shown as being circular and filler particles 120 are shown with an elongated form. It is to be understood that the filler particles may have any form. While the filler particles 118, 120 may have a particle size which is less than one third of the cap body thickness, filler particles 116 are illustrated with a particle size of about two third of the cap body thickness. Cap 12 may be configured to comprise about three to five filler particles 116.

FIG. 9A shows the arrangement comprising semiconductor package 10, cap 12 and cooling element 14 after assembly. Fixing may be effectuated by screw or clamp. As can be seen in FIG. 9A, the surfaces of semiconductor package 10 and cooling element 14 show irregularities. A gap 122 may be formed between cap 12 and semiconductor package 10 and a gap 124 may be formed between cap 12 and cooling element 14 due to these irregularities. It is to be understood that the gap or gaps may not extend over the whole surface but that the gap may essentially correspond to some air bubbles.

During the process of soldering the semiconductor package 10 to a circuit board or by heating the arrangement purposely the electrically insulating material of cap 12 may reach its glass transition temperature. The electrically insulating material may then change from the solid state to the glassy state, i.e. a somewhat soft state of the material without being a liquid state. Due to the pressure by the fixation means, e.g. by a screw or a clamp, the semiconductor package 10 and the cooling element 14 press the cap 12. The cap 12 adapts to the irregularities in the surface of the semiconductor package 10 and the cooling element 14. The gaps 122 and 124 may disappear or at least diminish.

If during the glass transition phase the cap 12 were to become too small or the thickness were to decrease too much, the electrically insulating of the cap would not be provided any more. The particles 116 then may take the function of spacers. They do not change from the solid state during the glass transition temperature of the electrically insulating material and so the distance between the semiconductor package 10 and the cooling element 14 may not go below the particle size of particles 116.

Figure 10:
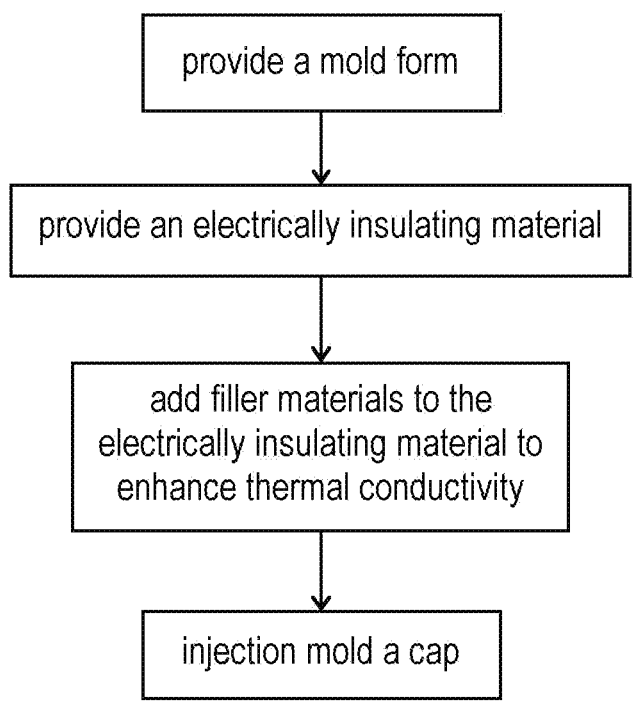
FIG. 10 illustrates schematically in a flow diagram a method for producing a cap.

FIG. 10 shows in a flow diagram an exemplary method for producing a cap. First a mold form is provided. The mold form may comprise a form to form the cap body and the attachment means. In embodiments the mold form may comprise a form to form a rim. Further, an electrically insulating material as discussed above is provided. The electrically insulating material may have filler material added. The filler materials may enhance the thermal conductivity of the electrically insulating material without compromising the electrically insulating feature of the material. Using the provided electrically insulating material comprising the filler material a cap is injection molded in the provided mold form. Injection molding allows for a rapid and cheap mass production of the cap.

Although in the figures the cap is shown comprising a sole layer of an electrically insulating material possibly with added fillers, the disclosure is not limited thereto. In embodiments the cap may be provided with a second layer comprising an electrically conductive material on a surface opposite of the semiconductor package when in a mounted state. The electrically conductive material may comprise a metal. Especially, the electrically conductive material may comprise aluminum. In other words, the cap may comprise the thermal interface and the cooling element in one component.

The electrically conductive material may be deposited on the cap after molding. In a further embodiment the electrically conductive material may be introduced into the mold form prior to injection molding the cap. In this case the cooling element may be molded to the cap during the molding process.

Although attaching the cap to the semiconductor package is described above, the disclosure is not limited thereto. In embodiments, the attachment means of the cap may be adapted to the cooling element. The cap may be attached to the cooling element prior to assemble semiconductor package cap and cooling element.

In a first example a cap provides a thermal interface to an exposed die pad of a semiconductor package, wherein the cap is formed from electrically insulating material; the cap comprises attachment means configured to engage around at least a part of the semiconductor package thereby fixing the cap to the semiconductor package.

In a second example, the cap of example 1 comprises at least two attachment means arranged at opposite sides of the cap.

In a third example, the cap of example 1 or example 2 comprises a cap body configured to cover at least partly a main surface of the semiconductor package which comprises the exposed die pad, the attachment means comprising a first part extending from the cap body along a side surface of the semiconductor package and a second part connected to the first part at a side opposite the cap body, the second part comprising a contact face directed towards the cap body, wherein a distance between the contact face and the cap body is configured so as to clamp the at least part of the semiconductor package between the cap body and the contact face.

In a fourth example, the cap of example 3 wherein the distance between the contact face and the cap body corresponds to a thickness of the semiconductor package.

In a fifth example, the cap of example 3 wherein the distance between the contact face and the cap body is adapted to an indentation or to a protrusion of the semiconductor package.

In a sixth example, the cap of examples 3 to 5 wherein the cap body comprises a rim configured to extend at least partly over side surfaces of the semiconductor package when the cap is fixed to the semiconductor package.

In an example 7, the cap of examples 3 to 6 wherein the cap body comprises a through-hole adapted to a hole in the semiconductor package for fixing a cooling element.

In an example 8, the cap of examples 3 to 7 wherein the cap body has a thickness between about 30 micrometer and about 600 micrometer, and preferably between about 100 micrometer and about 500 micrometer and more preferably between about 250 micrometer and about 350 micrometer.

In an example 9, the cap of example 1 comprises a first cap body and a second cap body, the first cap body configured to cover at least partly a first main surface of the semiconductor package which comprises the exposed die pad, the attachment means comprising a first part extending from the first cap body to the second cap body along a side surface of the semiconductor package to a second main surface of the semiconductor package opposite the first main surface and the second cap body configured to cover at least partly the second first main surface of the semiconductor package, wherein a distance between the first cap body and the second cap body is configured so as to clamp the semiconductor package between the first cap body and the second cap body.

In an example 10, the cap of any of the preceding claims, wherein the electrically insulating material comprises a thermosoftening plastic, preferably one out of PPS, PEEK, PC, TPE, LCP, PET, PEI, PPS, PPA, PA 66, PE, PS, PMMA or a thermosetting plastic material, preferably an epoxy resin.

In an example 11, the cap of any of the preceding claims, wherein the electrically insulating material comprises a glass transition temperature which is in between a usual temperature of the semiconductor package during operation and a soldering temperature used for attaching the semiconductor package to a board.

In an example 12, the cap of any of the preceding claims, wherein the electrically insulating material comprises a thermally conductive filler material.

In an example 13, the cap of example 12, wherein the thermally conductive filler material comprises one out of BN, AL2O3, SiN, SiO2, AlN, SiC, BeO.

In an example 14, the cap of examples 2 and 13, wherein a particle size of the filler material is less than a third of the cap body thickness.

In an example 15, the cap of example 14, further comprises about three to five filler particles with a particle size of about two-thirds of the cap body thickness.

In an example 16, the cap of any of the preceding examples further comprises a layer of an electrically conductive material, the layer being arranged on a side of the cap facing away from the semiconductor package.

In an example 17, an arrangement comprises a cap according to any of the preceding examples and the semiconductor package to which the cap is attachable.

In an example 18, the arrangement according to example 17 further comprises a cooling element, the cap to be arranged between the semiconductor package and the cooling element.

In an example 19, a method for producing a cap according to any of examples 1 to 16 comprises injection molding of the cap in a mold form.

In an example 20, the method according to example 19 further comprises placing a layer of an electrically conductive material into the mold form prior to injection molding the electrically insulating material to form a cap according to example 16.

While the invention has been illustrated and described with respect to one or more implementations, alterations and/or modifications may be made to the illustrated examples without departing from the spirit and scope of the appended claims. In particular regard to the various functions performed by the above described structures, the terms (including a reference to a "means") used to describe such structures are intended to correspond, unless otherwise indicated, to any structure which performs the specified function of the described structure (e.g., that is functionally equivalent), even though not structurally equivalent to the disclosed structure which performs the function in the herein illustrated exemplary implementations of the invention.

What is claimed is:

1. A semiconductor package system comprising:
   a semiconductor package which comprises:
      a semiconductor chip with a contact pad;
      an encapsulation body encapsulating the semiconductor chip and at least partially the contact pad, wherein a main face of the contact pad is at least partially exposed at a main surface of the encapsulation body; and
   a cap covering at least partially the exposed main face of the contact pad and at least partially the main surface of the encapsulation body, wherein the cap comprises:
      a cap body of an electrically insulating and thermally conductive material; and
      a fastening system, wherein the fastening system fastens the cap to the semiconductor package, and wherein the fastening system extends from the cap body towards the encapsulation body or along a side surface of the semiconductor package.

2. The semiconductor package system of claim 1, wherein the fastening system fastens the cap to the semiconductor package by at least one out of:
   engaging around at least a part of the semiconductor package; and
   engaging into at least one opening of the semiconductor package.

3. The semiconductor package system of claim 2, wherein the fastening system clamps the semiconductor package at an indentation or a protrusion of the semiconductor package.

4. The semiconductor package system of claim 1, wherein the fastening system provides one out of a snap connection and a matched joint connection.

5. The semiconductor package system of claim 1, wherein the fastening system clamps the semiconductor package between the cap body covering the exposed main face of the contact pad on a first main face of the semiconductor package and a further cap body covering at least partly a second main face of the semiconductor package opposite the first main face.

6. The semiconductor package system of claim 1, wherein the cap body comprises a rim that extends at least partly along side surfaces of the semiconductor package.

7. The semiconductor package system of claim 1, wherein the cap body comprises a flange projecting over a circumference of the encapsulation body, the flange projecting essentially parallel to the second main face of the contact pad.

8. The semiconductor package system of claim 7, wherein the cap body further comprises a recess accommodating at least partly the encapsulation body.

9. The semiconductor package system of claim 7, wherein the cap body further comprises a base directed towards the encapsulation body, the base having one out of
   an outline which is smaller or equal the outline of the encapsulation body; and
   an outline which is smaller than or equal to the outline of the exposed contact pad surface.

10. The semiconductor package system of claim 1, wherein the cap material comprises a thermosoftening plastic, preferably one out of PPS, PEEK, PC, TPE, LCP, PET, PEI, PPS, PPA, PA 66, PE, PS, PMMA or a thermosetting plastic material, preferably an epoxy resin.

11. The semiconductor package system of claim 1, wherein the cap material comprises a glass transition temperature which is in between a usual temperature of the semiconductor package during operation and a soldering temperature used for attaching the semiconductor package to a board.

12. The semiconductor package system of claim 1, wherein the cap material comprises a thermally conductive filler material, preferably one out of BN, AL2O3, SiN, SiO2, AlN, SiC, BeO.

13. The semiconductor package of claim 11, further comprising about three to five filler particles with a particle size of about 50 to 90% of a minimal cap body thickness.

14. The semiconductor package system of claim 1, the cap further comprising a layer of an electrically conductive material, the layer being arranged on a side of the cap facing away from the semiconductor package.

15. The semiconductor package system of claim 1, further comprising a cooling element, the cap to be arranged between the semiconductor package and the cooling element.

16. A cap configured to cover at least partly an at least partly exposed contact pad at a main surface of a semiconductor package and at least partially the main surface of the semiconductor package, wherein the cap comprises:
- a cap body of an electrically insulating and thermally conductive material; and
- a fastening system to fasten the cap to the semiconductor package, the fastening system extending from the cap body.

17. The cap of claim 16, wherein the fastening system fastens the cap to the semiconductor package by at least one out of
- engaging around at least a part of the semiconductor package; and
- engaging into at least one opening of the semiconductor package.

18. The cap of claim 16, wherein the cap body is box-shaped comprising a surrounding flange projecting over a circumference of the box shape, the flange projecting essentially parallel to a main face of the cap body.

19. The cap of claim 18, wherein the cap body further comprises a recess to accommodate at least partly the semiconductor package.

20. The cap of claim 18, wherein the cap body further comprises a base, the base having an outline smaller or equal the outline of the semiconductor package.

21. The cap of claim 16, wherein the cap body comprises a rim that extends at least partly over side surfaces of the semiconductor package.

22. Use of an electrically insulating and heat conducting cap for dissipating heat from a semiconductor package, wherein the cap is fastened by a fastening system to the semiconductor package, wherein the fastening system fastens the cap by one out of a snap connection and a matched joint connection to the semiconductor package, wherein the cap when fastened covers at least partly an at least partly exposed contact pad at a main surface of the semiconductor package and at least partially the main surface of the semiconductor package.

23. The use of the cap according to claim 22, wherein the cap is used as a thermal interface between the semiconductor package and a cooling element, the cap dissipating the heat to the cooling element.

24. The use of the cap according to claim 22, wherein the cap is fastened to the semiconductor package after soldering the semiconductor package to a board.

* * * * *